United States Patent
Ueno

(10) Patent No.: US 12,055,278 B2
(45) Date of Patent: Aug. 6, 2024

(54) VEHICLE LIGHTING DEVICE AND VEHICLE LAMP

(71) Applicant: Toshiba Lighting & Technology Corporation, Kanagawa (JP)

(72) Inventor: Misaki Ueno, Ehime-ken (JP)

(73) Assignee: Toshiba Lighting & Technology Corporation, Kanagawa (JP)

(*) Notice: Subject to any disclaimer, the term of this patent is extended or adjusted under 35 U.S.C. 154(b) by 0 days.

(21) Appl. No.: 18/449,653

(22) Filed: Aug. 14, 2023

(65) Prior Publication Data

US 2024/0102625 A1 Mar. 28, 2024

(30) Foreign Application Priority Data

Sep. 27, 2022 (JP) ................................. 2022-153229

(51) Int. Cl.
| | |
|---|---|
| F21S 41/00 | (2018.01) |
| F21S 41/19 | (2018.01) |
| F21S 41/20 | (2018.01) |
| F21V 29/74 | (2015.01) |
| F21Y 115/10 | (2016.01) |

(52) U.S. Cl.
CPC ........... F21S 41/194 (2018.01); F21S 41/192 (2018.01); F21S 41/20 (2018.01); F21V 29/74 (2015.01); F21Y 2115/10 (2016.08)

(58) Field of Classification Search
CPC ........ F21S 41/194; F21S 41/192; F21S 41/20; F21V 29/74
See application file for complete search history.

(56) References Cited

U.S. PATENT DOCUMENTS

| | | | |
|---|---|---|---|
| 2010/0259151 A1 | 10/2010 | Chen et al. | |
| 2014/0117391 A1 | 5/2014 | Ha et al. | |
| 2021/0164633 A1* | 6/2021 | Ueno | F21S 43/14 |
| 2022/0373149 A1* | 11/2022 | Okubo | F21S 41/265 |
| 2023/0012854 A1* | 1/2023 | Walters | F21S 41/143 |
| 2023/0213777 A1* | 7/2023 | Zhang | F21S 41/143 |
| | | | 362/459 |
| 2024/0019102 A1* | 1/2024 | Ichikawa | F21V 31/005 |

FOREIGN PATENT DOCUMENTS

| | | |
|---|---|---|
| EP | 3663640 | 6/2020 |
| JP | 2016195099 | 11/2016 |
| JP | 2019220425 | 12/2019 |

* cited by examiner

*Primary Examiner* — Gerald J Sufleta, II
(74) *Attorney, Agent, or Firm* — JCIPRNET

(57) ABSTRACT

A vehicle lighting device includes a socket, a substrate, at least one light emitting element, a frame part, a sealing part, and a lens. The substrate is provided on one end side of the socket. The light emitting element is provided on the substrate. The frame part surrounds the light emitting element. The sealing part is provided on an inner side of the frame part and covers the light emitting element. The lens is provided on the sealing part and includes an optical part into which a light emitted from the light emitting element enters. The optical part includes a first portion from which the light entered is emitted. The first portion protrudes to a side opposite to a sealing part side. A contour of the first portion is a substantially rectangular shape as viewed from a direction along a central axis of the optical part.

5 Claims, 10 Drawing Sheets

VEHICLE LIGHTING DEVICE AND VEHICLE LAMP

CROSS-REFERENCE TO RELATED APPLICATION

This application claims the priority benefit of Japan application serial no. 2022-153229, filed on Sep. 27, 2022. The entirety of the above-mentioned patent application is hereby incorporated by reference herein and made a part of this specification.

BACKGROUND

Technical Field

Embodiments of the disclosure relate to a vehicle lighting device and a vehicle lamp.

Related Art

From the viewpoint of energy saving and a long service life, it is becoming widespread to use a vehicle lighting device including light emitting elements such as light emitting diodes in place of a vehicle lighting device including a lamp having a filament. The vehicle lighting device including light emitting elements is attached to a housing of a vehicle lamp. Further, the vehicle lamp is provided with an optical element such as a reflector, so a predetermined luminous flux or light distribution pattern can be obtained.

Herein, a luminance distribution of a portion where the light of the vehicle lighting device is emitted has a significant influence on an optical design of the optical element provided at the vehicle lamp. Further, it is necessary for the vehicle lighting device to obtain a predetermined luminous flux. Thus, it is desired that a predetermined luminance distribution can be obtained and light emission efficiency can be improved in the vehicle lighting device.

Thus, a technique has been proposed to provide a lens on a light emission side of the light emitting elements (see, for example, Japanese Patent Application Laid-Open No. 2016-195099). If the lens is provided, since light extraction efficiency can be improved, light emission efficiency can be improved. In the case where the lens is provided, it is possible to set the luminance distribution of the light emission surface of the lens to a luminance distribution of the vehicle lighting device.

However, when a general lens (e.g., a lens having a circular contour when viewed from a direction along the central axis of the vehicle lighting device) is used, light may spread to unintended regions, and the predetermined luminance distribution cannot be obtained. Further, in the case of a general lens, the luminance of the light emission surfaces of the light emitting elements has a significant influence on the luminance distribution on the light emission surface of the lens. Thus, it is necessary to keep the relative positions constant between the light emitting elements and the lens. However, there is variation (manufacturing errors) in joining positions of the light emitting elements or a joining position of the lens. Thus, if a general lens is used, it is possible that the predetermined luminance distribution cannot be obtained.

Thus, it has been desired to develop a technique capable of obtaining a predetermined luminance distribution and improving light emission efficiency.

SUMMARY

A vehicle lighting device according to an embodiment includes a socket, a substrate, at least one light emitting element, a frame part, a sealing part, and a lens. The substrate is provided on one end side of the socket. The light emitting element is provided on the substrate. The frame part has a frame shape, is provided on the substrate, and surrounds the light emitting element. The sealing part is provided on an inner side of the frame part and covers the light emitting element. The lens is provided on the sealing part and includes an optical part into which a light emitted from the light emitting element enters. The optical part includes a first portion from which the light entered is emitted. The first portion protrudes to a side opposite to a sealing part side. A contour of the first portion is a substantially rectangular shape as viewed from a direction along a central axis of the optical part.

According to the embodiment of the disclosure, it is possible to provide a vehicle lighting device and a vehicle lamp capable of obtaining a predetermined luminance distribution and improving light emission efficiency.

DESCRIPTION OF THE EMBODIMENTS

Embodiments of the disclosure provide a vehicle lighting device and a vehicle lamp capable of obtaining a predetermined luminance distribution and improving light emission efficiency.

Hereinafter, embodiments will be illustrated with reference to the drawings. In each drawing, the same components will be labeled with the same reference signs, and detailed description thereof will be omitted as appropriate.

Vehicle Lighting Device

A vehicle lighting device 1 according to this embodiment may be provided, for example, on an automobile or a railway vehicle. Examples of the vehicle lighting device 1 provided on an automobile include those used in a front combination light (e.g., an appropriate combination of a daytime running lamp (DRL), a position lamp, a turn signal lamp, etc.) and a rear combination light (e.g., an appropriate combination of a stop lamp, a tail lamp, a turn signal lamp, a back lamp, a fog lamp, etc.). However, the applications of the vehicle lighting device 1 are not limited thereto.

Figure 1:
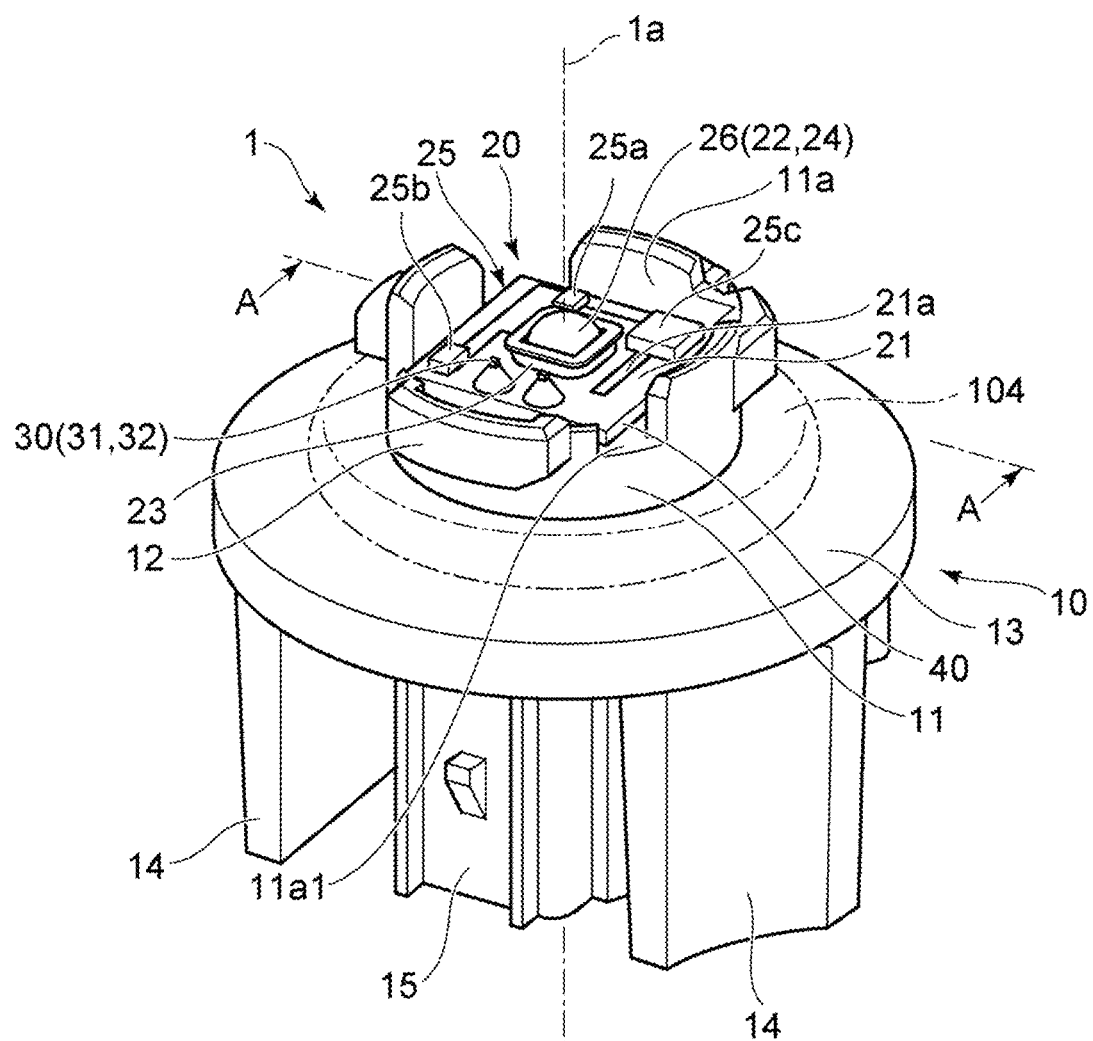
FIG. 1 is a schematic perspective view for illustrating a vehicle lighting device according to this embodiment.
Figure 2:
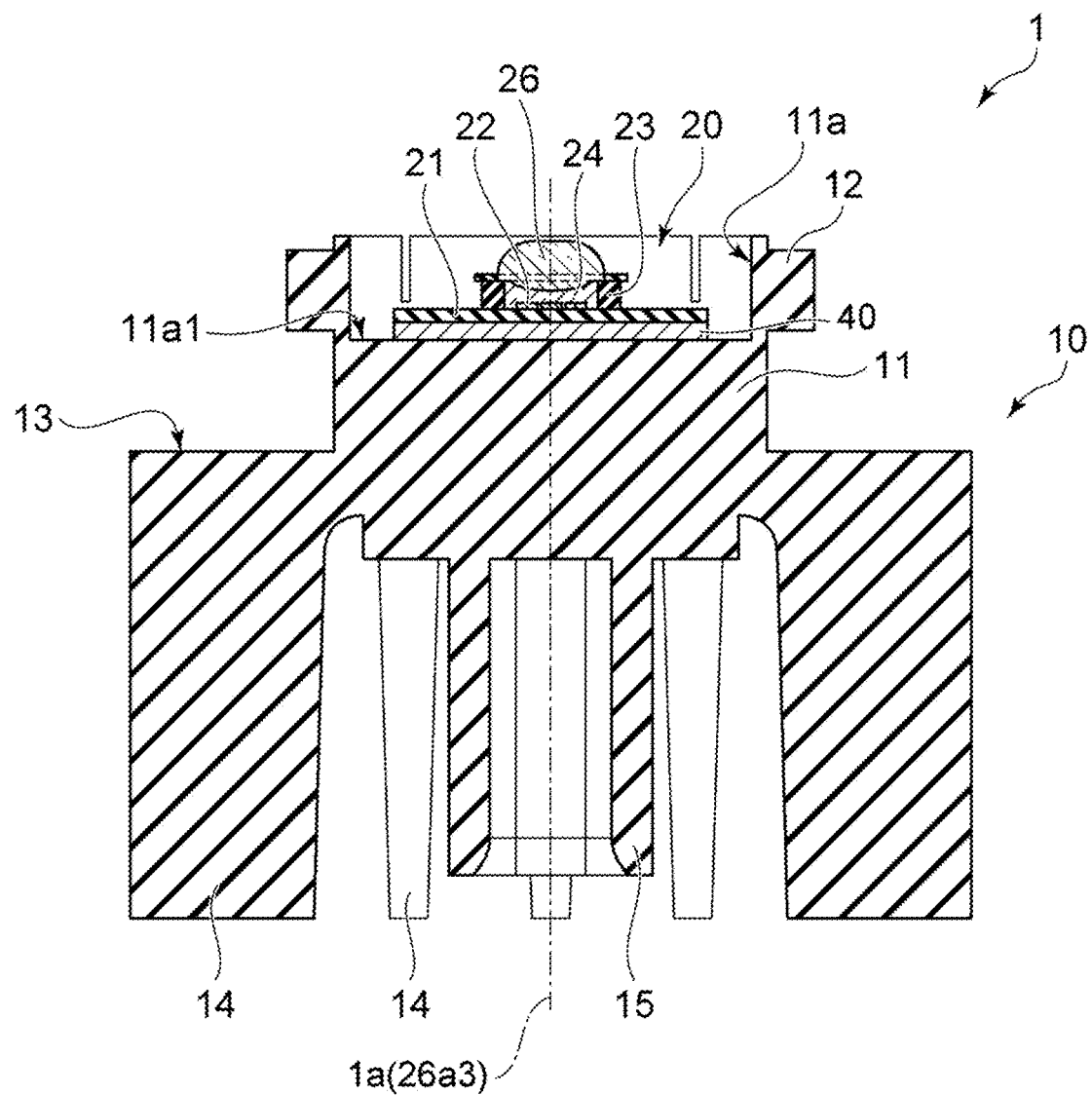
FIG. 2 is a cross-sectional view taken along line A-A of the vehicle lighting device in FIG. 1.

FIG. 1 is a schematic perspective view for illustrating the vehicle lighting device 1 according to this embodiment. FIG. 2 is a cross-sectional view taken along line A-A of the vehicle lighting device 1 in FIG. 1. As shown in FIG. 1 and FIG. 2, the vehicle lighting device 1 is provided with, for example, a socket 10, a light emitting module 20, a power supply part 30, and a heat transfer part 40.

The socket 10 includes, for example, a mounting part 11, a bayonet 12, a flange 13, a heat dissipation fin 14, and a connector holder 15. The mounting part 11 is provided on a surface of the flange 13 opposite to a side where the heat dissipation fin 14 is provided. An outer shape of the mounting part 11 may be a columnar shape. The outer shape of the mounting part 11 is, for example, a cylindrical shape. For example, the mounting part 11 has a recess 11a that is opened at an end on a side opposite to the flange 13 side.

The bayonet 12 is provided on a lateral surface of the mounting part 11, for example. The bayonet 12 protrudes toward an outer side of the vehicle lighting device 1. The bayonet 12 is opposed to the flange 13. The bayonet 12 may be provided as a plurality of bayonets 12. The bayonet 12 is used when, for example, mounting the vehicle lighting device 1 to a housing 101 of a vehicle lamp 100 (to be described later). The bayonet 12 may be used for a twist lock.

The flange 13 has a plate shape. The flange 13 has a substantially circular plate shape, for example. A lateral surface of the flange 13 is located more outward of the vehicle lighting device 1 than a lateral surface of the bayonet 12.

The heat dissipation fin 14 is provided on a side of the flange 13 opposite to the mounting part 11 side. The heat dissipation fin 14 may be provided as at least one heat dissipation fin 14. For example, as shown in FIG. 1 and FIG. 2, a plurality of heat dissipation fins 14 may be provided at the socket 10. The plurality of heat dissipation fins 14 may be arranged side by side in a predetermined direction. The heat dissipation fin 14 has a plate shape or a tubular shape, for example.

The connector holder 15 is provided on a side of the flange 13 opposite to the mounting part 11 side. The connector holder 15 may be arranged side by side with the heat dissipation fin 14. The connector holder 15 has a tubular shape, and a connector 105 having a seal member 105a is inserted into the connector holder 15.

The socket 10 serves a function of holding the light emitting module 20 and the power supply part 30, and a function of transmitting heat generated in the light emitting module 20 to outside. Thus, the socket 10 may be formed of a material with a high thermal conductivity. For example, the socket 10 may be formed of metal such as an aluminum alloy.

In recent years, it has been desired that the socket 10 is lightweight and can efficiently dissipate heat generated in the light emitting module 20. Thus, for example, the socket 10 may also be formed of a high thermal conductivity resin. The high thermal conductivity resin includes, for example, a resin and a filler using an inorganic material. The high thermal conductivity resin is obtained by, for example, mixing a resin such as polyethylene terephthalate (PET) or nylon, and a filler using carbon or aluminum oxide.

If the socket 10 includes a high thermal conductivity resin and has the mounting part 11, the bayonet 12, the flange 13, the heat dissipation fin 14, and the connector holder 15 integrally formed, it is possible to efficiently dissipate heat generated in the light emitting module 20. Further, it is possible to reduce the weight of the socket 10. In that case, the mounting part 11, the bayonet 12, the flange 13, the heat dissipation fin 14, and the connector holder 15 may be integrally formed using a method such as injection molding. Further, the socket 10, the power supply part 30, and the heat transfer part 40 may also be integrally formed using insert molding.

The light emitting module 20 (substrate 21) is provided on one end side of the socket 10. For example, the light emitting module 20 is provided on the heat transfer part 40. The light emitting module 20 includes, for example, a substrate 21, a light emitting element 22, a frame part 23, a sealing part 24, a circuit element 25, and a lens 26.

The substrate 21 is adhered to an upper surface of the heat transfer part 40. In that case, the adhesive may be an adhesive with a high thermal conductivity. For example, the adhesive may be an adhesive mixed with a filler using an inorganic material.

The substrate 21 has a plate shape. A plane shape (shape as viewed from a direction along a central axis 1a of the vehicle lighting device 1) of the substrate 21 is, for example, a substantially rectangular shape. For example, the substrate 21 may be formed of an inorganic material such as ceramics (e.g., aluminum oxide or aluminum nitride) or an organic material such as paper phenol or glass epoxy. Further, the substrate 21 may also be a metal core substrate with the surface of a metal plate covered with an insulating material. In the case where the amount of heat generated by the light emitting element 22 is large, the substrate 21 may be formed using a material with a high thermal conductivity in consideration of heat dissipation. Examples of the material with a high thermal conductivity may include ceramics such as aluminum oxide or aluminum nitride, a high thermal conductivity resin, and a metal core substrate. Further, the substrate 21 may have a single-layer structure or may have a multi-layer structure.

Further, a wiring pattern 21a is provided on the surface of the substrate 21. The wiring pattern 21a is formed of, for example, a material mainly composed of silver or a material mainly composed of copper. Further, a coating part that covers the wiring pattern 21a or a film-shaped resistor (to be described later) may also be provided. The coating part may include a glass material, for example.

The light emitting element 22 is provided on the substrate 21 (a surface of the substrate 21 on a side opposite to the socket 10 side). The light emitting element 22 is electrically connected to the wiring pattern 21a. The light emitting element 22 may be provided as at least one light emitting element 22. Hereinafter, a case where a plurality of light emitting elements 22 are provided will be described. The plurality of light emitting elements 22 may be connected in series. The light emitting element 22 may be a light emitting diode, an organic light emitting diode, or a laser diode, for example.

The light emitting element 22 may be a chip-shaped light emitting element. If the light emitting element 22 is a chip-shaped light emitting element, it is possible to miniaturize the light emitting module 20 and thus miniaturize the vehicle lighting device 1. The chip-shaped light emitting element 22 may be mounted to the wiring pattern 21*a* by chip on board (COB). The chip-shaped light emitting element 22 may be any of an upper electrode type light emitting element, an upper and lower electrode type light emitting element, and a flip-chip type light emitting element. The quantity, size, and arrangement of the light emitting elements 22 are not limited to those illustrated herein and may be changed as appropriate according to the size and application of the vehicle lighting device 1.

The frame part 23 is provided on the substrate 21. The frame part 23 is adhered to the substrate 21. The frame part 23 has a frame shape and surrounds the light emitting elements 22. The contour of the frame part 23 as viewed from a direction along the central axis 1*a* of the vehicle lighting device 1 may be a substantially rectangular shape. The corners of the rectangular shape may be rounded or chamfered. The frame part 23 may have a rectangular tubular shape, for example.

For example, the frame part 23 is formed of a resin. The resin may be, for example, a thermoplastic resin such as polybutylene terephthalate (PBT), polycarbonate (PC), PET, nylon, polypropylene (PP), polyethylene (PE), and polystyrene (PS).

The frame part 23 may serve a function of defining a formation range of the sealing part 24 and a function as a reflector. Thus, to improve the reflectance, the frame part 23 may include particles of titanium oxide or may include a white resin. If the frame part 23 is provided, it is possible to improve utilization efficiency of the light emitted from the light emitting elements 22. Further, since the range in which the sealing part 24 is formed can be reduced, it is possible to miniaturize the light emitting module 20 and thus miniaturize the vehicle lighting device 1.

The sealing part 24 is provided on the inner side of the frame part 23. The sealing part 24 is provided to cover a region surrounded by the frame part 23. The sealing part 24 is provided to cover the light emitting elements 22. The sealing part 24 includes a resin having light-transmitting properties. For example, the sealing part 24 is formed by filling a resin on the inner side of the frame part 23. The filling of the resin is performed using, for example, a dispenser. The resin to be filled is, for example, a silicone resin.

Further, a phosphor may be included in the sealing part 24. The phosphor may be, for example, an yttrium-aluminum-garnet-based phosphor (YAG-based phosphor). However, the type of the phosphor may be changed as appropriate such that a predetermined light emission color can be obtained according to the application of the vehicle lighting device 1.

The circuit element 25 may be a passive element or an active element used to constitute a light emitting circuit having the light emitting elements 22. For example, the circuit element 25 is provided around the frame part 23 and is electrically connected to the wiring pattern 21*a*. The circuit element 25 is electrically connected to the light emitting elements 22 via the wiring pattern 21*a*. The circuit element 25 may also be provided at a lighting circuit provided outside the vehicle lighting device 1, for example.

By configuring in this manner, since the configuration of the light emitting module 20 can be simplified, it is possible to reduce the production cost of the vehicle lighting device 1. However, if the circuit element 25 is provided at the light emitting module 20, it becomes easy to protect the light emitting module 20 and make the light emitting module 20 multifunctional.

The circuit element 25 may be, for example, a resistor 25*a*, a protection element 25*b*, and a control element 25*c*. However, the type of the circuit element 25 is not limited to those illustrated and may be changed as appropriate according to the configuration of the light emitting circuit having the light emitting elements 22. For example, in addition to those mentioned above, the circuit element 25 may include a capacitor, a positive characteristic thermistor, a negative characteristic thermistor, an inductor, a surge absorber, a varistor, an integrated circuit, and an operational element.

The resistor 25*a* is provided on the substrate 21. The resistor 25*a* is electrically connected to the wiring pattern 21*a*. The resistor 25*a* may be, for example, a surface mount resistor, a resistor with lead wires (metal oxide film resistor), or a film-shaped resistor formed using screen printing. The resistor 25*a* illustrated in FIG. 1 is a surface mount resistor.

Herein, since there is variation in the forward voltage characteristics of the light emitting element 22, if the applied voltage between the anode terminal and the ground terminal is kept constant, variation occurs in the brightness (luminous flux, luminance, luminous intensity, illuminance) of the light irradiated from the light emitting element 22. Thus, to ensure that the brightness of the light irradiated from the light emitting element 22 falls within a predetermined range, the value of the current flowing through the light emitting element 22 is kept within a predetermined range by the resistor 25*a* connected in series with the light emitting element 22. In that case, by changing the resistance value of the resistor 25*a*, the value of the current flowing through the light emitting element 22 is kept within the predetermined range.

In the case where the resistor 25*a* is a surface mount resistor or a resistor with lead wires, a resistor 25*a* having an appropriate resistance value is selected according to the forward voltage characteristics of the light emitting element 22. In the case where the resistor 25*a* is a film-shaped resistor, if a part of the resistor 25*a* is removed, the resistance value can be increased. For example, if a laser light is irradiated onto the film-shaped resistor, a part of the film-shaped resistor can be easily removed. The quantity, arrangement, and size of the resistor 25*a* are not limited to those illustrated and may be changed as appropriate according to the quantity and specification of the light emitting elements 22.

The protection element 25*b* is provided on the substrate 21. The protection element 25*b* is electrically connected to the wiring pattern 21*a*. For example, the protection element 25*b* is provided to prevent a reverse voltage from being applied to the light emitting element 22 and to prevent pulse noise from a reverse direction from being applied to the light emitting element 22. For example, the protection element 25*b* may be a diode. The protection element 25*b* illustrated in FIG. 1 is a surface mount diode.

The control element 25*c* is provided on the substrate 21. The control element 25*c* is electrically connected to the wiring pattern 21*a*. The control element 25*c* is provided, for example, to switch a voltage applied to the light emitting element 22. The control element 25*c* may be, for example, a transistor or an integrated circuit. The control element 25*c* illustrated in FIG. 1 is a surface mount transistor.

The lens 26 is provided on the sealing part 24. The lens 26 is joined to at least one of the sealing part 24 and the frame part 23. A surface of the lens 26 on the sealing part 24 side is in close contact with the sealing part 24. The lens 26 may be adhered, for example, to an end of the frame part 23 on a side opposite to the substrate 21 side. Details about the lens 26 will be described later.

The power supply part 30 includes, for example, a plurality of power supply terminals 31 and a holding part 32. The plurality of power supply terminals 31 may be rod-shaped bodies. The plurality of power supply terminals 31 are arranged side by side in a predetermined direction, for example. One-side ends of the plurality of power supply terminals 31 protrude from a bottom surface 11a1 of the recess 11a. The one-side ends of the plurality of power supply terminals 31 are soldered to the wiring pattern 21a provided on the substrate 21. Other-side ends of the plurality of power supply terminals 31 are exposed inside a hole of the connector holder 15. The connector 105 is fitted to the plurality of power supply terminals 31 exposed inside the hole of the connector holder 15. The plurality of power supply terminals 31 are formed of metal such as a copper alloy, for example. The shape, arrangement, and material of the plurality of power supply terminals 31 are not limited to those illustrated and may be changed as appropriate.

As described above, the socket 10 may be formed of a material with a high thermal conductivity. However, a material with a high thermal conductivity may have electrical conductivity. For example, metal such as an aluminum alloy or a high thermal conductivity resins including a filler using carbon have electrical conductivity. Thus, the holding part 32 is provided to insulate between the plurality of power supply terminals 31 and the socket 10 having electrical conductivity. Further, the holding part 32 serves a function of holding the plurality of power supply terminals 31. In the case where the socket 10 is formed of a high thermal conductivity resin having insulating properties (e.g., high thermal conductivity resin including a filler using aluminum oxide), the holding part 32 may be omitted. In that case, the socket 10 holds the plurality of power supply terminals 31. The holding part 32 is formed of a resin having insulating properties, for example. The holding part 32 may be press-fitted into a hole provided at the socket 10 or adhered to an inner wall of the hole, for example.

The heat transfer part 40 has a plate shape and is provided between the socket 10 and the light emitting module 20 (substrate 21). For example, as shown in FIG. 1 and FIG. 2, the heat transfer part 40 may be adhered to the bottom surface 11a1 of the recess 11a. Further, the heat transfer part 40 may also be adhered inside a recess provided at the bottom surface 11a1 of the recess 11a. Further, the heat transfer part 40 may also be adhered onto a protruding pedestal provided at the bottom surface 11a1 of the recess 11a. The adhesive that adheres between the heat transfer part 40 and the socket 10 may be an adhesive with a high thermal conductivity. For example, the adhesive may be the same as the above-described adhesive that adheres between the light emitting module 20 (substrate 21) and the heat transfer part 40.

Further, the heat transfer part 40 and the socket 10 may be integrally formed by insert molding. Further, the heat transfer part 40 may be attached to the socket 10 via a layer including a thermal conductive grease (heat dissipation grease). The thermal conductive grease is obtained by, for example, mixing a filler using an inorganic material into a modified silicone.

The heat transfer part 40 is provided to facilitate transmission of heat generated in the light emitting module 20 to the socket 10. Thus, the heat transfer part 40 is formed of a material with a high thermal conductivity. For example, the heat transfer part 40 may be formed of metal such as aluminum, an aluminum alloy, copper, and a copper alloy. For example, in the case where relatively less heat is generated in the light emitting module 20 or in the case where the socket 10 is formed of metal, the heat transfer part 40 may be omitted. In the case where the heat transfer part 40 is omitted, the light emitting module 20 (substrate 21) is adhered to the bottom surface 11a1 of the recess 11a.

Figure 3:
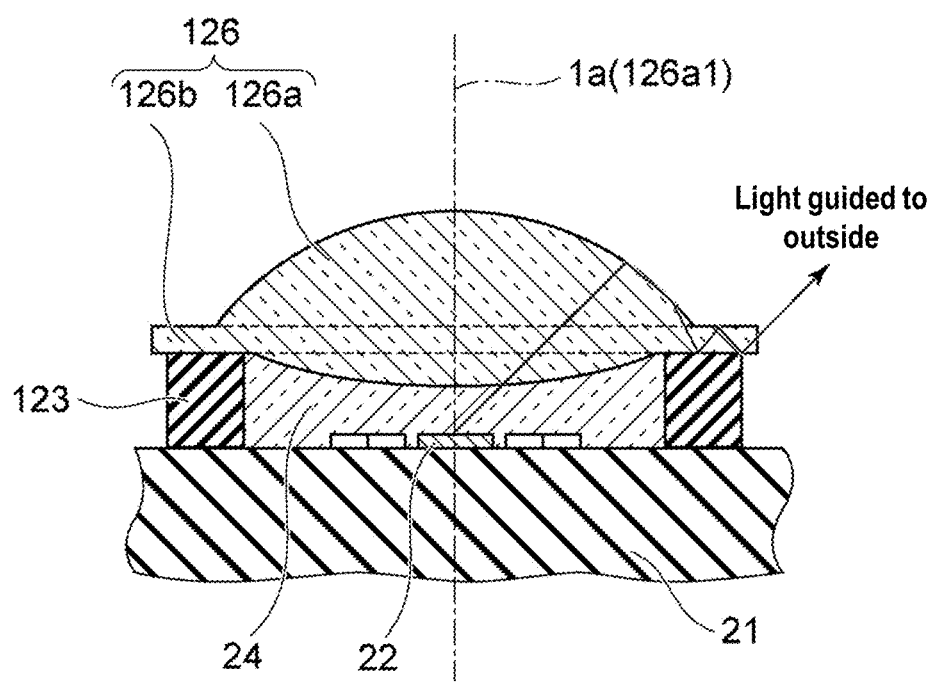
FIG. 3 is a schematic cross-sectional view for illustrating a lens and a frame part according to a comparative example.
Figure 4:
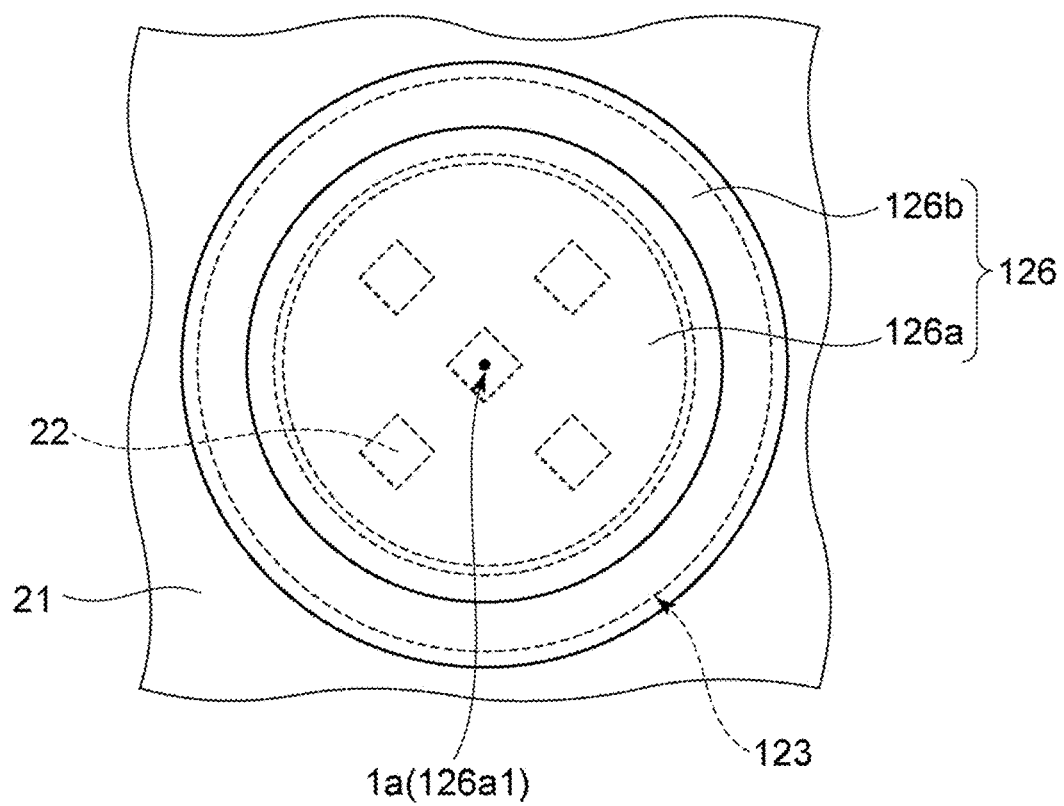
FIG. 4 is a schematic plan view of the lens and the frame part according to the comparative example, as viewed from a direction along the central axis of the vehicle lighting device.

Next, the lens 26 will be further described. FIG. 3 is a schematic cross-sectional view for illustrating a lens 126 and a frame part 123 according to a comparative example. FIG. 4 is a schematic plan view of the lens 126 and the frame part 123 according to the comparative example, as viewed from a direction along the central axis 1a of the vehicle lighting device 1. As shown in FIG. 4, when viewed from a direction along the central axis 1a of the vehicle lighting device 1, the contour of the frame part 123 is a circular shape. The frame part 123 has a cylindrical shape. The material of frame part 123 is a resin.

As shown in FIG. 3, the lens 126 is provided on the sealing part 24. The lens 126 is joined with at least one of the sealing part 24 and the frame part 123. As shown in FIG. 3 and FIG. 4, the lens 126 includes an optical part 126a and a brim 126b. The optical part 126a and the brim 126b are integrally formed. The optical part 126a and the brim 126b are formed of a light-transmitting material such as glass and a light-transmitting resin.

The optical part 126a may be a biconvex lens. A central axis 126a1 of the optical part 126a overlaps with the central axis 1a of the vehicle lighting device 1. As shown in FIG. 4, when viewed from a direction along the central axis 126a1 (central axis 1a of the vehicle lighting device 1) of the optical part 126a, the contour of the optical part 126a on a light incident side (sealing part 24 side) and the contour on a light emission side (opposite side to the sealing part 24 side) have circular shapes. The brim 126b has a ring shape. In a direction perpendicular to the central axis 126a1 of the optical part 126a, the brim 126b has a plate shape and surrounds a periphery of the optical part 126a.

Further, as shown in FIG. 4, five light emitting elements 22 are provided. The center of one light emitting element 22 overlaps with the central axis 126a1 of the optical part 126a. Four light emitting elements 22 are provided at positions that are rotationally symmetric with respect to the central axis 126a1 of the optical part 126a.

Herein, if the lens 126 is provided, since light extraction efficiency can be improved, light emission efficiency can be improved. However, in the case of the vehicle lighting device 1, it is necessary to set a luminance distribution of a light emission surface of the lens 126 to a predetermined luminance distribution.

Figure 5:
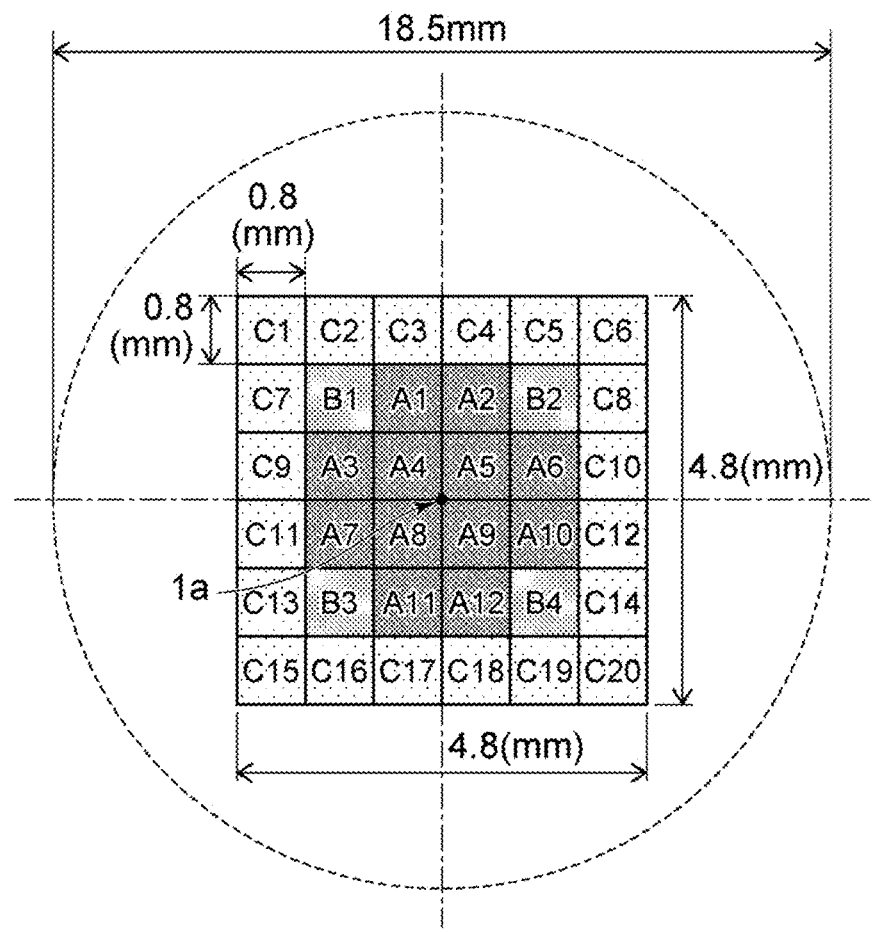
FIG. 5 is a view for illustrating a luminance distribution required for the lens of the vehicle lighting device.

FIG. 5 is a view for illustrating a luminance distribution required for the lens of the vehicle lighting device 1. As shown in FIG. 5, the luminance distribution may be evaluated in a square require with one side being 4.8 mm centered on the central axis 1a of the vehicle lighting device 1. In that case, by dividing the square region with one side being 4.8 mm into thirty-six equal parts and determining a luminous intensity in each of the thirty-six equally divided regions (square regions with one side being 0.8 mm), it is possible to evaluate the luminance distribution of the lens.

For example, in the case of an arrangement of five light emitting elements 22 shown in FIG. 4, the luminous intensity in each region may be set to the range below.

$3\% < A < 10\%$ $3\% < B < 10\%$ $C < 2\%$ $70\% < A+B$ $90\% < A+B+C$

The luminous intensity in a region with a diameter being 18.5 mm centered on the central axis 1a of the vehicle lighting device 1 is taken as 100%. Further, "A" is (luminous intensity in each of region A1 to region A12/luminous intensity in region with diameter being 18.5 mm)×100(%). That is, "A" serves for evaluating the luminance in the vicinity of the central axis of the lens.

"B" is (luminous intensity in each of region B1 to region B4/luminous intensity in region with diameter being 18.5 mm)×100(%). That is, "B" serves for evaluating the luminance at diagonal ends of the regions in the vicinity of the central axis of the lens.

"C" is (luminous intensity in each of region C1 to region C20/luminous intensity in region with diameter being 18.5 mm)×100(%). That is, "C" serves for evaluating the luminance in the vicinity of the periphery of the lens.

Figure 6:
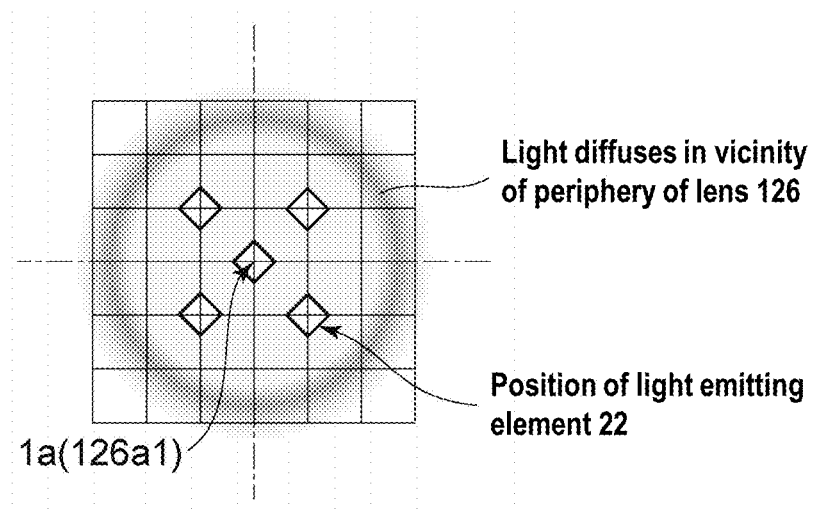
FIG. 6 is a view for illustrating a luminance distribution on a light emission surface of the lens according to the comparative example.

FIG. 6 is a view for illustrating the luminance distribution on the light emission surface of the lens 126 according to the comparative example. As can be learned from FIG. 6, the luminance at the positions of the light emitting elements 22 increases. That is, the luminance of the light emission surfaces of the light emitting elements 22 has a significant influence on the luminance distribution on the light emission surface of the lens 126. Further, it can be learned that the luminance of a ring-shaped region in the vicinity of the periphery of the lens 126 increases. When the luminance of the ring-shaped region in the vicinity of the periphery of the lens 126 increases, it becomes difficult to set "C<2%" described above.

The reason that the luminance of the ring-shaped region in the vicinity of the periphery of the lens 126 increases may be described as follows. As shown in FIG. 3, a part of the light emitted from the light emitting element 22 and entering the optical part 126a of the lens 126 is reflected inside the optical part 126a and enters into the brim 126b. The light entering into the brim 126b propagates inside the brim 126b and exits from the brim 126b to outside. Thus, a ring-shaped region with a high luminance is formed in the vicinity of the periphery of the lens 126.

Herein, as described above, the luminance at the positions of the light emission surfaces of the light emitting elements 22 increases. Thus, joining positions of the plurality of light emitting elements 22 are set such that the luminous intensity in each region shown in FIG. 4 is within the range described above. However, there is variation (manufacturing errors) in the joining positions of the light emitting elements 22 or a joining position of the lens 126. Thus, the joining positions of the light emitting elements 22 or the joining position of the lens 126 may deviate from predetermined positions.

Figure 7:
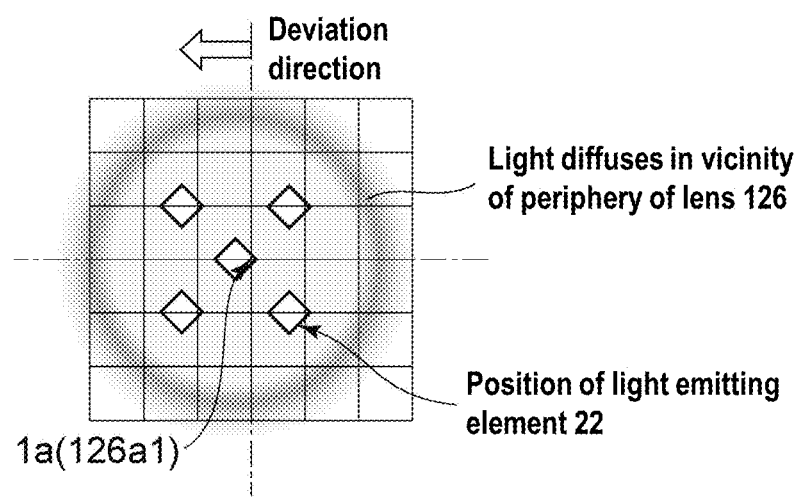
FIG. 7 is a view for illustrating a luminance distribution on the light emission surface of the lens in the case where joining positions of the plurality of light emitting elements deviate from predetermined positions.

FIG. 7 is a view for illustrating a luminance distribution on the light emission surface of the lens 126 in the case where the joining positions of the plurality of light emitting elements 22 deviate from predetermined positions. As can be learned from FIG. 7, when the joining positions of the plurality of light emitting elements 22 deviate from the predetermined positions, a portion with a high luminance also deviates from an intended position. Thus, the luminous intensity in each region shown in FIG. 4 may not be within the range described above. This is also true in the case where the joining position of the lens 126 deviates from the predetermined position.

Figure 8:
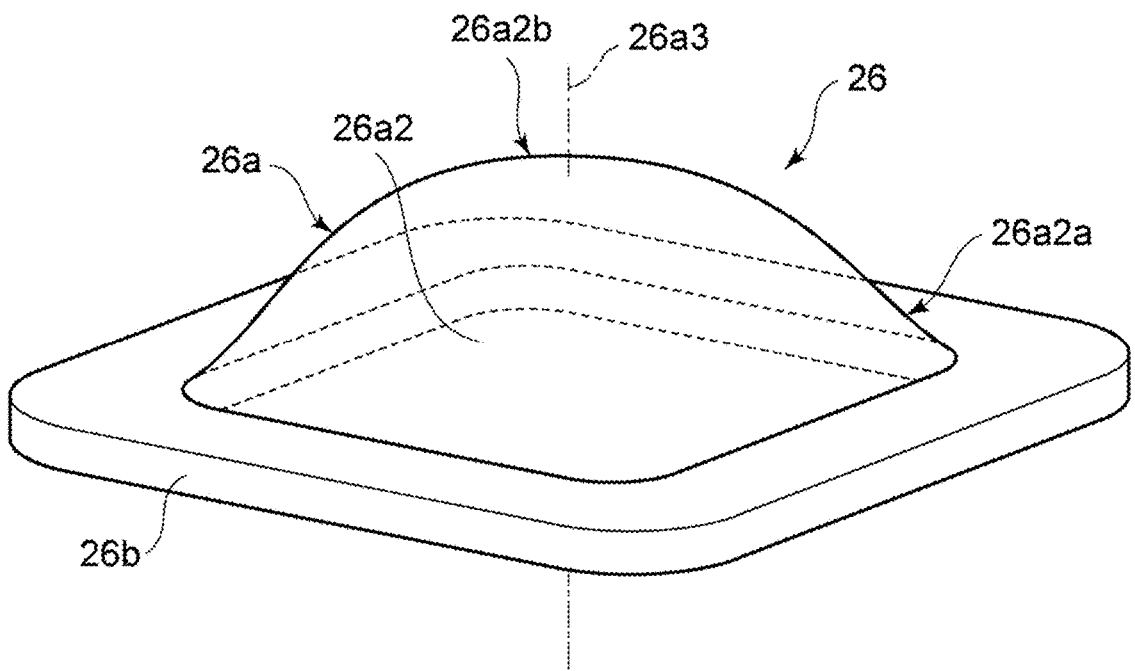
FIG. 8 is a schematic perspective view of the lens according to this embodiment, as viewed from a light emission side.
Figure 9:
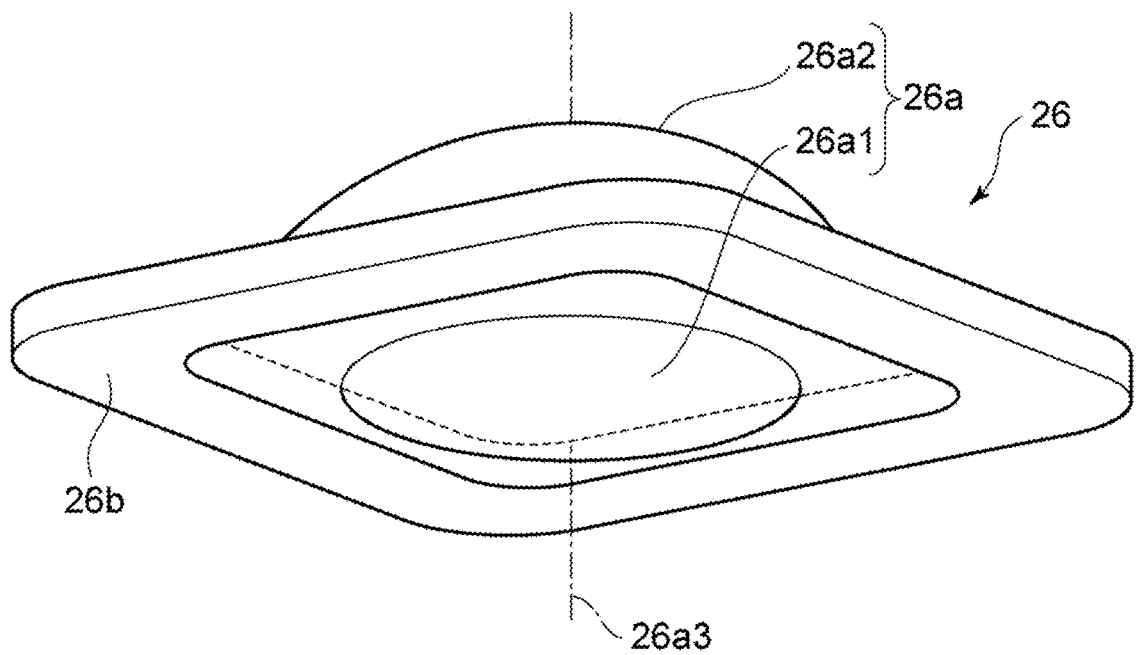
FIG. 9 is a schematic perspective view of the lens as viewed from a light incident side.
Figure 10:
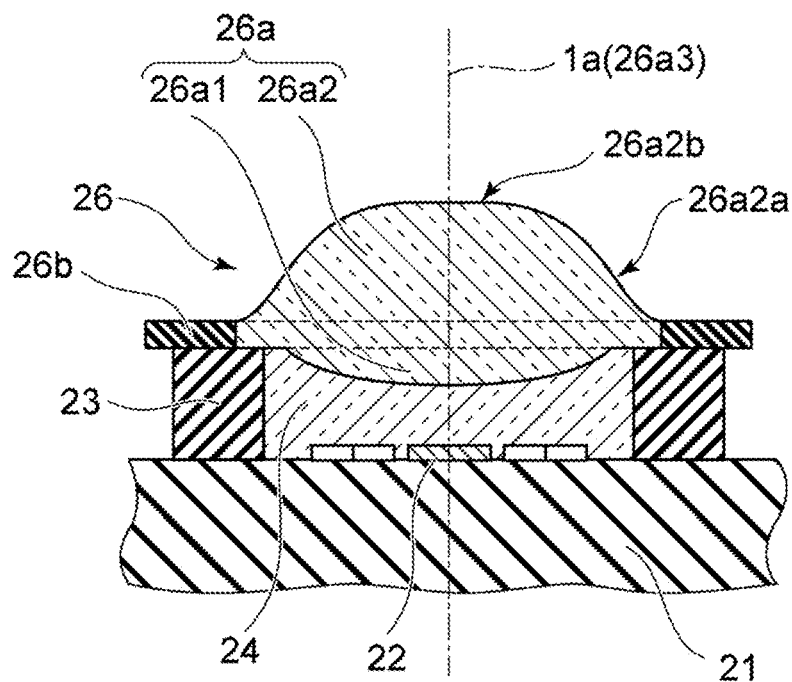
FIG. 10 is a schematic cross-sectional view of the lens.
Figure 11:
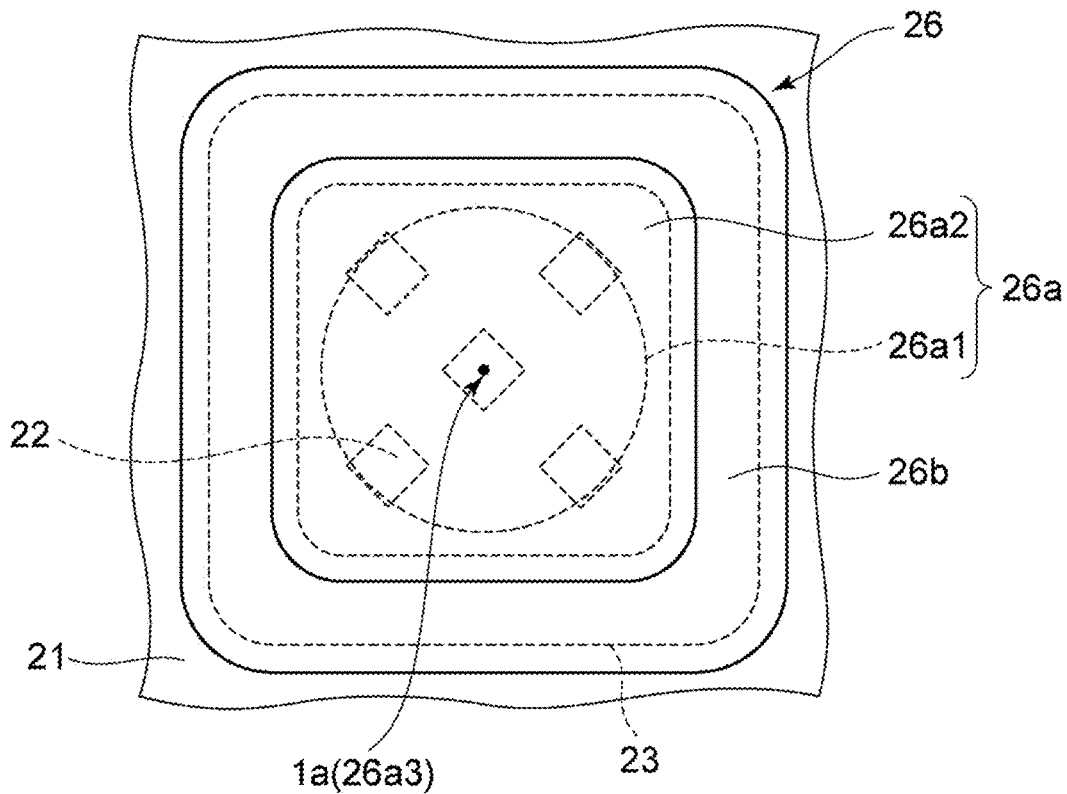
FIG. 11 is a schematic plan view of the lens as viewed from a direction along the central axis of the vehicle lighting device.

FIG. 8 is a schematic perspective view of the lens 26 according to this embodiment, as viewed from a light emission side. FIG. 9 is a schematic perspective view of the lens 26 as viewed from a light incident side. FIG. 10 is a schematic cross-sectional view of the lens 26. FIG. 11 is a schematic plan view of the lens 26 as viewed from a direction along the central axis 1a of the vehicle lighting device 1.

As shown in FIG. 8 to FIG. 11, the lens 26 includes, for example, an optical part 26a and a brim 26b. The light emitted from the light emitting elements 22 enters the optical part 26a. A central axis 26a3 of the optical part 26a overlaps with the central axis 1a of the vehicle lighting device 1. As shown in FIG. 11, five light emitting elements 22 are provided. The center of one light emitting element 22 overlaps with the central axis 26a3 of the optical part 26a. Four light emitting elements 22 are provided at positions that are rotationally symmetric with respect to the central axis 26a3 of the optical part 26a.

The optical part 26a includes, for example, a portion 26a1 (corresponding to an example of a second portion) and a portion 26a2 (corresponding to an example of a first portion). A central axis of the portion 26a1 overlaps with a central axis of the portion 26a2. The portion 26a1 and the portion 26a2 may be integrally formed. The portion 26a1 and the portion 26a2 are formed of a light-transmitting material such as glass and a light-transmitting resin, for example.

The light emitted from the light emitting elements 22 enters the portion 26a1. The portion 26a1 protrudes from an end of the portion 26a2 on the sealing part 24 side toward the sealing part 24 side. As shown in FIG. 9 and FIG. 11, when viewed from a direction along the central axis 26a3 (central axis 1a of the vehicle lighting device 1) of the optical part 26a, the contour of the portion 26a1 may be a substantially circular shape. For example, as shown in FIG. 9 and FIG. 10, the shape of the portion 26a1 may be a part of a sphere. The portion 26a1 is in close contact with the sealing part 24.

Further, as shown in FIG. 11, when viewed from a direction along the central axis 26a3 (central axis 1a of the vehicle lighting device 1) of the optical part 26a, the center of each of the plurality of light emitting elements 22 may be located on the inner side of the contour of the portion 26a1. By configuring in this manner, the light emitted from the plurality of light emitting elements 22 can be efficiently caused to enter the portion 26a1.

The light entered into the optical part 26a is emitted from the portion 26a2. The portion 26a2 protrudes to a side opposite to the sealing part 24 side. As shown in FIG. 8 and FIG. 11, when viewed from a direction along the central axis 26a3 (central axis 1a of the vehicle lighting device 1) of the optical part 26a, the contour of the portion 26a2 may be a substantially rectangular shape. The corners of the rectangular shape may be rounded. As described above, four light emitting elements 22 are provided at positions that are rotationally symmetric with respect to the central axis 26a3 of the optical part 26a. Thus, as shown in FIG. 11, the contour of the portion 26a2 may be a substantially square shape. The corners of the square shape may be rounded. Further, a line segment connecting the centers of two adjacent light emitting elements 22 may be made substantially parallel to the side of the contour of the square shape of the portion 26a2.

An outer surface (lateral surface 26a2a and top surface 26a2b) of the portion 26a2 may be composed of curved surfaces or a combination of curved surfaces and planar surfaces. For example, as shown in FIG. 8 and FIG. 10, the lateral surface 26a2a of the portion 26a2 may be a curved surface protruding outward. The top surface 26a2b of the portion 26a2 may be a planar surface substantially perpendicular to the central axis 26a3 of the optical part 26a. The top surface 26a2b of the portion 26a2 may also be a curved surface protruding outward.

Further, the outer surface of the portion 26a2 may be a surface that scatters light. For example, roughness that causes scattering when light entering the optical part 26a is emitted may be provided on the surface of the lateral surface 26a2a of the portion 26a2 and the surface of the top surface 26a2b of the portion 26a2. For example, by blasting the outer surface of the portion 26a2, fine roughness may be provided on the outer surface of the portion 26a2.

The brim 26b has a plate shape and surrounds the periphery of the optical part 26a. For example, the surface of the brim 26b is perpendicular to the central axis 26a3 (central axis 1a of the vehicle lighting device 1) of the optical part 26a. When viewed from a direction along the central axis 26a3 (central axis 1a of the vehicle lighting device 1) of the optical part 26a, the brim 26b has a substantially rectangular frame shape. The corners of the rectangular shape may be rounded. As shown in FIG. 11, in the case where the contour of the portion 26a2 is a substantially square shape, the brim 26b may have a substantially square frame shape. The corners of the square shape may be rounded. Further, when viewed from a direction along the central axis 26a3 (central axis 1a of the vehicle lighting device 1) of the optical part 26a, the sides of the contour of the brim 26b may be made substantially parallel to the sides of the contour of the portion 26a2.

The brim 26b may be formed of a material that is difficult for the light entering the optical part 26a to pass through. For example, the brim 26b may be formed of a resin or metal. In that case, the material of the brim 26b may be a material with a high reflectance with respect to the light entering the optical part 26a. For example, the material of the brim 26b may be metal such as aluminum, an aluminum alloy, and stainless steel, a resin including light scattering particles (e.g., particles of titanium oxide), or a white resin. The brim 26b may be adhered or welded to the periphery of the optical part 26a. The optical part 26a may also be press-fitted to the inner side of the plate-shaped brim 26b. In the case where the optical part 26a and the brim 26b are formed of a resin, the optical part 26a and the brim 26b may be integrally formed using two-color molding. In the case where the optical part 26a is formed of a resin and the brim 26b is formed of metal, the optical part 26a and the brim 26b may be integrally formed using insert molding.

A part of the light emitted from the light emitting elements 22 and entering the optical part 26a of the lens 26 is reflected inside the optical part 26a and incident on the brim 26b. Since the brim 26b is formed of a material that is difficult for the light to pass through, the light incident on the brim 26b is prevented from propagating inside the brim 26b and exiting to outside. In that case, if the brim 26b is formed of a material with a high reflectance with respect to the light entering the optical part 26a, the light incident on the brim 26b is reflected toward inside of the optical part 26a. The light reflected toward inside of the optical part 26a is emitted to outside the optical part 26a. Thus, since light extraction efficiency in intended regions can be improved, light emission efficiency can be improved.

Figure 12:
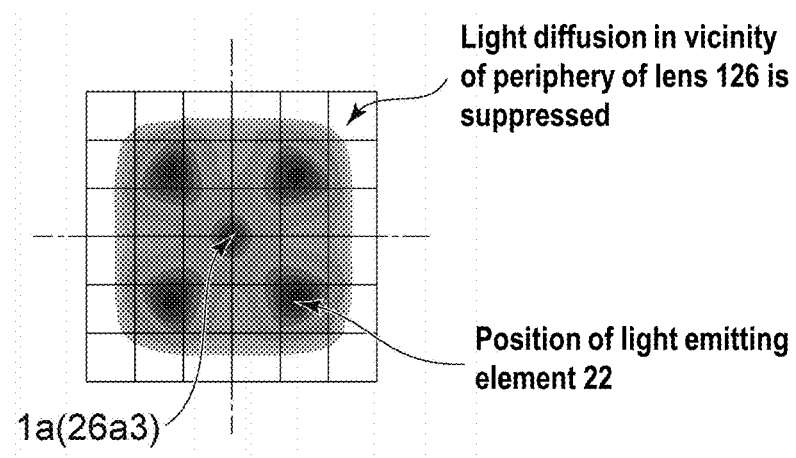
FIG. 12 is a view for illustrating a luminance distribution on the light emission surface of the lens.

FIG. 12 is a view for illustrating a luminance distribution on the light emission surface of the lens 26. As described above, since the brim 26b is formed of a material that is difficult for the light to pass through, it is possible to suppress emission of light from the brim 26b. Thus, as can be learned from FIG. 12, it is possible to suppress occurrence of a ring-shaped region with a high luminance (as shown in FIG. 6) in the vicinity of the periphery of the lens 26. As a result, it becomes easy to set "C<2%" described above.

As can be learned from FIG. 12, the luminance at the positions of the light emitting elements 22 becomes significantly high. However, since the positions of the light emitting elements 22 are "region A1 to region A12" or "region B1 to region B4" described above, it becomes easy to set "3%<A<10%" or set "3%<B<10%".

Furthermore, as described above, if the outer surface of the portion 26a2 is a surface that scatters light, as can be learned from FIG. 12, it is possible to increase the luminance on the entire outer surface of the portion 26a2. Thus, it becomes easy to set "70%<A+B" or set "90%<A+B+C".

Figure 13:
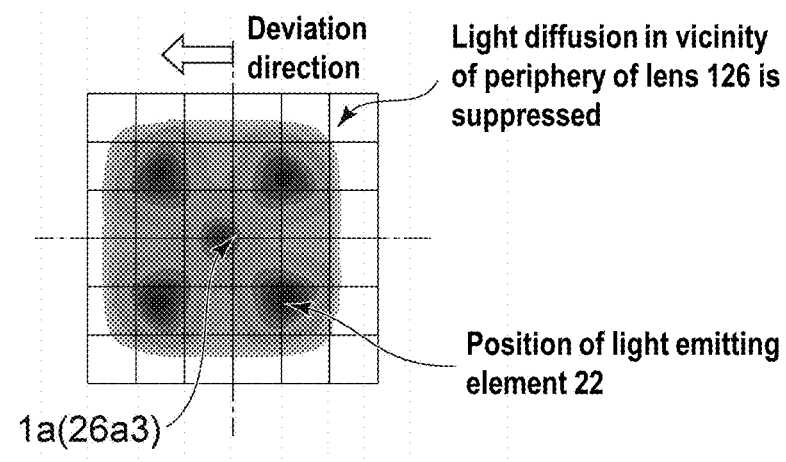
FIG. 13 is a view for illustrating a luminance distribution on the light emission surface of the lens in the case where the joining positions of the plurality of light emitting elements deviate from predetermined positions.

FIG. 13 is a view for illustrating a luminance distribution on the light emission surface of the lens 26 in the case where the joining positions of the plurality of light emitting elements 22 deviate from predetermined positions. As can be learned from FIG. 13, when the joining positions of the plurality of light emitting elements 22 deviate from the predetermined positions, the portion with a high luminance also deviates from the intended position. However, since the luminance at the positions of the light emitting elements 22 becomes significantly high, even if the position of the portion with a high luminance deviates slightly, it is possible to suppress the influence on the luminous intensity in each region shown in FIG. 4.

Further, if the outer surface of the portion 26a2 is a surface that scatters light, since the luminance on the entire outer surface of the portion 26a2 can be increased, the influence on the luminous intensity in each region shown in FIG. 4 is further reduced.

As described above, with the lens 26 according to this embodiment, compared to the lens 126 according to the comparative example, it is possible to expand optical images of four light emitting elements 22 provided at positions that are rotationally symmetric with respect to the central axis 26a3 of the optical part 26a. Further, if the outer surface of the lens 26 (portion 26a2) is a surface that scatters light, due to the light scattering effect, it is possible to blur optical images of the five light emitting elements 22. That is, it is possible to reduce contrast among the light emitting elements 22. Thus, even if relative positions between the light emitting elements 22 and the lens 26 deviate due to manufacturing errors or the like, robustness against positional deviation can be improved.

Vehicle Lamp

In an embodiment of the disclosure, a vehicle lamp 100 including the vehicle lighting device 1 may be provided. The descriptions associated with the vehicle lighting device 1 above and modification examples of the vehicle lighting device 1 (e.g., those including features of the disclosure in which a person skilled in the art has added, deleted, or changed the design of components as appropriate) may be applied to the vehicle lamp 100.

In the following description, as an example, the case where the vehicle lamp 100 is a front combination light provided on an automobile will be described. However, the vehicle lamp 100 is not limited to a front combination light provided on an automobile. The vehicle lamp 100 may be any vehicle lamp provided on an automobile or a railway vehicle.

Figure 14:
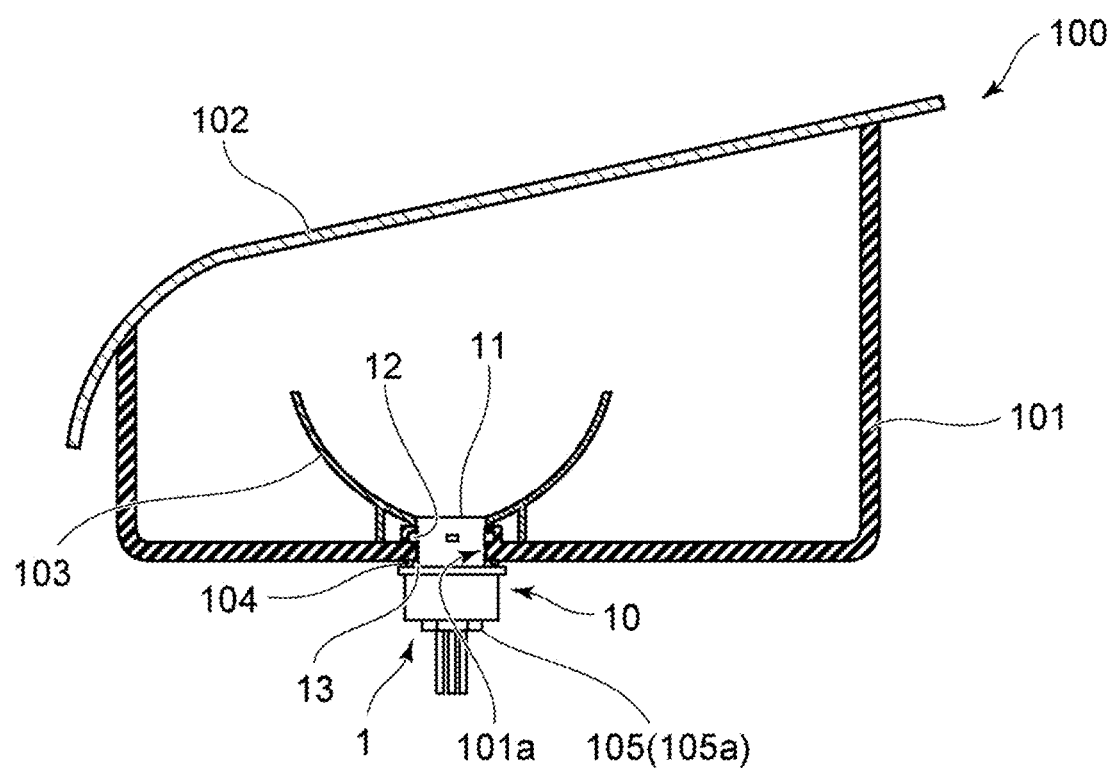
FIG. 14 is a schematic partial cross-sectional view for illustrating a vehicle lamp.

FIG. 14 is a schematic partial cross-sectional view for illustrating the vehicle lamp 100. As shown in FIG. 14, the vehicle lamp 100 includes, for example, a vehicle lighting device 1, a housing 101, a cover 102, an optical element 103, a seal member 104, and a connector 105.

The vehicle lighting device 1 is attached to the housing 101. The housing 101 holds the mounting part 11. The housing 101 has a box shape that is opened on one end side. The housing 101 is formed of a resin or the like through which light does not pass. An attachment hole 101a, into which a portion of the mounting part 11 provided with the bayonet 12 is inserted, is provided at a bottom surface of the housing 101. A recess, into which the bayonet 12 provided at the mounting part 11 is inserted, is provided at a periphery of the attachment hole 101a. Although the case where the attachment hole 101a is directly provided at the housing 101 has been illustrated, an attachment member having the attachment hole 101a may also be provided at the housing 101.

When attaching the vehicle lighting device 1 to the vehicle lamp 100, the portion of the mounting part 11 provided with the bayonet 12 is inserted into the attachment hole 101a, and the vehicle lighting device 1 is rotated. Then, for example, the bayonet 12 is held at a fitting part provided at the periphery of the attachment hole 101a. This attachment method is called a twist lock.

The cover 102 is provided to close the opening of the housing 101. The cover 102 is formed of a light-transmitting resin or the like. The cover 102 may also serve a function such as a lens.

The light emitted from the vehicle lighting device 1 is incident on the optical element 103. The optical element 103 performs reflection, diffusion, light guiding, condensing, formation of a predetermined light distribution pattern, etc. on the light emitted from the vehicle lighting device 1. For example, the optical element 103 illustrated in FIG. 14 is a reflector. In that case, the optical element 103 reflects the light emitted from the vehicle lighting device 1 to form a predetermined light distribution pattern.

The seal member 104 is provided between the flange 13 and the housing 101. The seal member 104 has an annular shape and is formed of a material having elasticity such as rubber and a silicone resin.

When the vehicle lighting device 1 is attached to the vehicle lamp 100, the seal member 104 is sandwiched between the flange 13 and the housing 101. Thus, the internal space of the housing 101 can be sealed by the seal member 104. Further, due to the elastic force of the seal member 104, the bayonet 12 is pressed against the housing 101. Thus, it is possible to prevent the vehicle lighting device 1 from detaching from the housing 101.

The connector 105 is fitted to ends of the plurality of power supply terminals 31 exposed inside the connector holder 15. A lighting circuit or the like is electrically connected to the connector 105. Thus, by fitting the connector 105 to the ends of the plurality of power supply terminals 31, it is possible to electrically connect the lighting circuit or the like with the light emitting elements 22.

Further, a seal member 105a is provided at the connector 105. When the connector 105 including the seal member 105a is inserted into the connector holder 15, the inside of the connector holder 15 is sealed and becomes watertight.

Although embodiments of the disclosure have been illustrated above, these embodiments are presented as examples and are not intended to limit the scope of the disclosure. These novel embodiments may be implemented in various other forms, and various omissions, replacements, changes, etc., may be made within a range that does not deviate from the gist of the disclosure. These embodiments and their modification examples are included within the scope and gist of the disclosure and are included within the scope of the disclosure described in claims and their equivalents. Further, each of the embodiments described above may be combined with each other.

The following shows supplementary notes associated with the embodiments described above.

Supplementary Note 1

A vehicle lighting device including:
a socket;
a substrate provided on one end side of the socket;
at least one light emitting element provided on the substrate;
a frame part that has a frame shape, is provided on the substrate, and surrounds the light emitting element;
a sealing part that is provided on an inner side of the frame part and covers the light emitting element; and
a lens that is provided on the sealing part and includes an optical part into which a light emitted from the light emitting element enters, wherein
the optical part includes a first portion from which the light entered is emitted,
the first portion protrudes to a side opposite to a sealing part side, and
a contour of the first portion is a substantially rectangular shape as viewed from a direction along a central axis of the optical part.

Supplementary Note 2

The vehicle lighting device according to Supplementary note 1, wherein
a lateral surface of the first portion is a curved surface protruding outward, and
a top surface of the first portion is a planar surface or a curved surface protruding outward.

Supplementary Note 3

The vehicle lighting device according to Supplementary note 2, wherein
roughness that causes scattering when the light entered is emitted is provided on a surface of the lateral surface of the first portion and a surface of the top surface of the first portion.

Supplementary Note 4

The vehicle lighting device according to any one of Supplementary notes 1 to 3, wherein
the optical part further includes a second portion into which the light enters,
the second portion protrudes to the sealing part side, and
a contour of the second portion is a substantially circular shape as viewed from a direction along the central axis of the optical part.

Supplementary Note 5

The vehicle lighting device according to any one of Supplementary notes 1 to 4, wherein
the lens further includes a brim that has a plate shape and surrounds a periphery of the optical part, and
the brim includes a material with a high reflectance with respect to the light entering the optical part.

Supplementary Note 6

A vehicle lamp including:
the vehicle lighting device according to any one of Supplementary notes 1 to 5; and
a housing to which the vehicle lighting device is attached.

What is claimed is:

1. A vehicle lighting device comprising:
a socket;
a substrate provided on one end side of the socket;
at least one light emitting element provided on the substrate;
a frame part that has a frame shape, is provided on the substrate, and surrounds the light emitting element;
a sealing part that is provided on an inner side of the frame part and covers the light emitting element; and
a lens that is provided on the sealing part and comprises an optical part into which a light emitted from the light emitting element enters, wherein
the optical part comprises a first portion from which the light entered is emitted,
the first portion protrudes to a side opposite to a sealing part side, and
a contour of the first portion is a substantially rectangular shape as viewed from a direction along a central axis of the optical part, wherein
a lateral surface of the first portion is only a curved surface that protrudes outward, and
a top surface of the first portion is a curved surface protruding outward.

2. The vehicle lighting device according to claim 1, wherein
roughness that causes scattering when the light entered is emitted is provided on a surface of the lateral surface of the first portion and a surface of the top surface of the first portion.

3. The vehicle lighting device according to claim 1, wherein
the optical part further comprises a second portion into which the light enters,
the second portion protrudes to the sealing part side, and
a contour of the second portion is a substantially circular shape as viewed from a direction along the central axis of the optical part.

4. The vehicle lighting device according to claim 1, wherein
the lens further comprises a brim that has a plate shape and surrounds a periphery of the optical part, and
the brim comprises a material with a high reflectance with respect to the light entering the optical part.

5. A vehicle lamp comprising:
the vehicle lighting device according to claim 1; and
a housing to which the vehicle lighting device is attached.

* * * * *